United States Patent
Lin et al.

(10) Patent No.: US 10,673,385 B2
(45) Date of Patent: Jun. 2, 2020

(54) SUPPLY MODULATOR, MODULATED POWER SUPPLY CIRCUIT, AND ASSOCIATED CONTROL METHOD

(71) Applicant: MEDIATEK Inc., Hsin-Chu (TW)

(72) Inventors: Shih-Mei Lin, Hsin-Chu (TW); Che-Hao Meng, Hsin-Chu (TW); Da-Wei Sung, Hsin-Chu (TW); Chien-Wei Kuan, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 30 days.

(21) Appl. No.: 16/040,594

(22) Filed: Jul. 20, 2018

(65) Prior Publication Data

US 2019/0140597 A1 May 9, 2019

Related U.S. Application Data

(60) Provisional application No. 62/583,069, filed on Nov. 8, 2017.

(51) Int. Cl.
| | |
|---|---|
| *H03F 3/217* | (2006.01) |
| *H03F 1/02* | (2006.01) |
| *H02M 3/158* | (2006.01) |
| *G05F 1/565* | (2006.01) |
| *H02M 3/335* | (2006.01) |

(52) U.S. Cl.
CPC .......... *H03F 1/0227* (2013.01); *G05F 1/565* (2013.01); *H02M 3/1582* (2013.01); *H02M 3/33569* (2013.01); *H03F 1/0211* (2013.01); *H03F 1/0244* (2013.01); *H03F 3/217* (2013.01); *H03F 2200/102* (2013.01); *H03F 2200/432* (2013.01)

(58) Field of Classification Search
CPC ............. H03F 1/0227; H03F 2200/102; H03F 2200/432; H03F 3/217; H03F 3/2173; H03F 3/2171; H03F 1/0244; H03F 1/0211; H03F 2200/504; H03F 1/0222; G05F 1/565; H02M 3/1582; H02M 3/33569; H03G 3/3042
USPC ........................................ 330/136, 251, 297
See application file for complete search history.

(56) References Cited

U.S. PATENT DOCUMENTS

| | | | |
|---|---|---|---|
| 7,116,947 B2 * | 10/2006 | Tanabe ................. | H03F 1/0211 455/91 |
| 8,698,558 B2 | 4/2014 | Mathe et al. | |

(Continued)

*Primary Examiner* — Khanh V Nguyen
(74) *Attorney, Agent, or Firm* — McClure, Qualey & Rodack, LLP

(57) ABSTRACT

A supply modulator, a modulated power supply circuit, and associated control method are provided. The modulated power supply circuit includes the supply modulator and a DC-DC voltage converter, and the supply modulator includes a linear amplifier and a switching converter. The linear amplifier generates an AC component of a modulated voltage according to a regulated voltage and an envelope tracking signal. The supply voltage is converted to the regulated voltage by the DC-DC voltage converter, and the regulated voltage is greater than or less than the supply voltage. The switching converter includes a step-down circuit and a path selection circuit. The path selection circuit selects one of the supply voltage and the regulated voltage as a DC input voltage. The step-down circuit converts the DC input voltage to a DC component of the modulated voltage which is less than the DC input voltage.

20 Claims, 9 Drawing Sheets

(56) References Cited

U.S. PATENT DOCUMENTS

| | | | |
|---|---|---|---|
| 8,774,739 B2* | 7/2014 | Ripley | H04B 1/1607 |
| | | | 330/296 |
| 9,065,509 B1* | 6/2015 | Yan | H04B 1/0475 |
| 9,098,099 B2* | 8/2015 | Park | H03F 1/0227 |

* cited by examiner

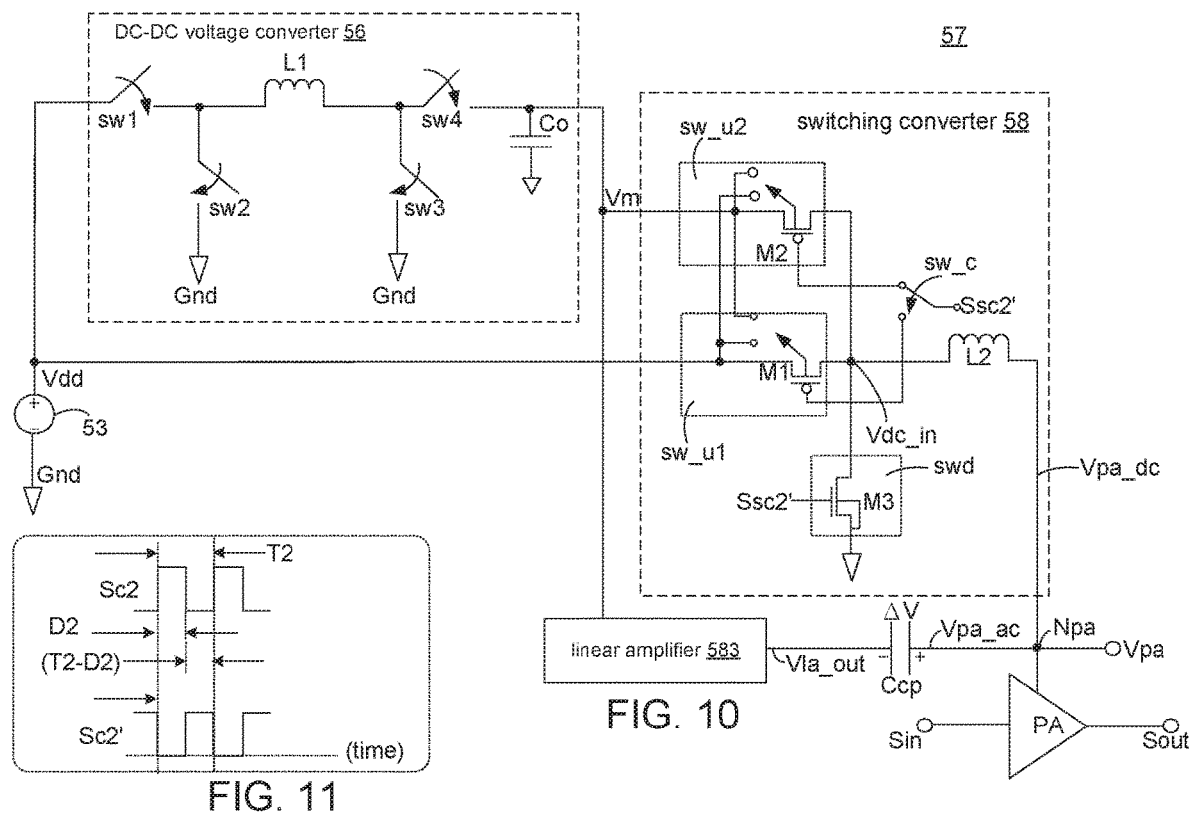

SUPPLY MODULATOR, MODULATED POWER SUPPLY CIRCUIT, AND ASSOCIATED CONTROL METHOD

This application claims the benefit of U.S. provisional application Ser. No. 62/583,069, filed Nov. 8, 2017, the disclosure of which is incorporated by reference herein in its entirety.

BACKGROUND OF THE INVENTION

Field of the Invention

The invention relates in general to a supply modulator, a power supply circuit, and an associated control method, and more particularly to a supply modulator, a modulated power supply circuit, and an associated control method for providing a modulated voltage to a power amplifier.

Description of the Related Art

FIG. 1A (prior art) is a block diagram illustrating supplying a supply voltage to a power amplifier based on a fix drain bias approach. In FIG. 1A, the power amplifier (PA) 11 operates based on a supply voltage Vdd having a constant DC value. After receiving an input signal Sin, the power amplifier 11 amplifies the input signal Sin to generate an amplified output signal Sout.

FIG. 1B (prior art) is a schematic diagram illustrating power supplied to and consumed by the power amplifier based on the fixed drain bias approach. The horizontal line Ln1 represents that the supply voltage Vdd supplied to the power amplifier 11 is constant, In FIG. 1B, the area shown with oblique lines (Ppa) represents actual power consumption of the power amplifier 11, and the area shown with dotted screentone (Pa1) represents the power which is provided to but not utilized by the power amplifier 11, Therefore, the area shown with dotted screentone (Pa1) implies the unnecessary power loss in the power amplifier 11.

As shown in FIG. 1B, the fixed drain bias approach employs a fixed supply voltage Vdd to the power amplifier 11, but the power consumed by the power simplifier varies all the time. In consequence, the fixed drain bias approach results in considerable power loss and brings thermal issues.

The supply voltage Vdd is provided by a voltage source, typically a battery. As the fixed drain bias approach is not power efficient, battery life becomes shorter. Therefore, an efficient approach to reduce unnecessary power dissipation is desired.

SUMMARY OF THE INVENTION

The invention is directed to a supply modulator, a modulated power supply circuit, and an associated control method capable of providing a modulated voltage to a power amplifier.

According to a first aspect of the present invention, a supply modulator configured for supplying a modulated voltage to a power amplifier is provided. The supply modulator includes a linear amplifier and a switching converter. Being electrically connected to a direct current to direct current (DC-DC) voltage converter, the linear amplifier is configured for generating an alternating current (AC) component of the modulated voltage according to a regulated voltage and an envelope tracking signal. The DC-DC voltage converter converts a supply voltage to the regulated voltage, and the regulated voltage is greater than or less than the supply voltage. The switching converter includes a step-down circuit and a path selection circuit. The step-down circuit is electrically connected to the power amplifier and configured for converting a direct current (DC) input voltage to a DC component of the modulated voltage. The DC component of the modulated voltage is less than the DC input voltage. The path selection circuit is electrically connected to the DC-DC voltage converter and the step-down circuit and configured for transmitting one of the supply voltage and the regulated voltage which is utilized as the DC input voltage to the step-down circuit.

According to a second aspect of the present invention, a modulated power supply circuit configured for supplying a modulated voltage to a power amplifier is provided. The modulated power supply circuit includes a direct current to direct current (DC-DC) converter and a supply modulator. The DC-DC voltage converter is configured for converting a supply voltage to a regulated voltage, wherein the regulated voltage is greater than or less than the supply voltage. The supply modulator includes a linear amplifier and a switching converter, and the switching converter includes a step-down circuit and a path selection circuit. Being electrically connected to the DC-DC voltage converter, the linear amplifier is configured for generating an alternating current (AC) component of the modulated voltage according to the regulated voltage and an envelope tracking signal. The step-down circuit is electrically connected to the power amplifier and configured for converting a direct current (DC) input voltage to a DC component of the modulated voltage, The DC component of the modulated voltage is less than the DC input voltage. The path selection circuit is electrically connected to the DC-DC voltage converter and the step-down circuit and configured for transmitting one of the supply voltage and the regulated voltage which is utilized as the DC input voltage to the step-down circuit.

According to a third aspect of the present invention, a control method of a modulated power supply circuit is provided. The modulated power supply circuit supplies a modulated voltage to a power amplifier, and the control method includes following steps. Firstly, a supply voltage is converted to a regulated voltage, wherein the regulated voltage is greater than or less than the supply voltage. Then, an alternating current (AC) component of the modulated voltage is generated according to the regulated voltage and an envelope tracking signal. Later, a supply voltage is received, and one of the supply voltage and the regulated voltage is utilized as a DC input voltage. Finally, the DC input voltage is converted to a direct current (DC) component of the modulated voltage. The DC component of the modulated voltage is less than the DC input voltage.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 10 is a schematic diagram illustrating an implementation of the selection circuit.

FIG. 11 is a schematic diagram illustrating the switching control signal Ssc2 for controlling the step-down switch in the DC-DC voltage converter.

DETAILED DESCRIPTION OF THE INVENTION

To improve the operating lifetime of the battery, an envelope tracking (hereinafter, ET) power management approach is provided in the present disclosure. Instead of providing a fixed supply voltage Vdd to the power amplifier, a dynamically adjusted modulated voltage Vpa is supplied to the power amplifier. As the modulated voltage Vpa is varied by the envelope of the input signal Sin of the power amplifier, the power loss can be significantly reduced.

Figure 2A:
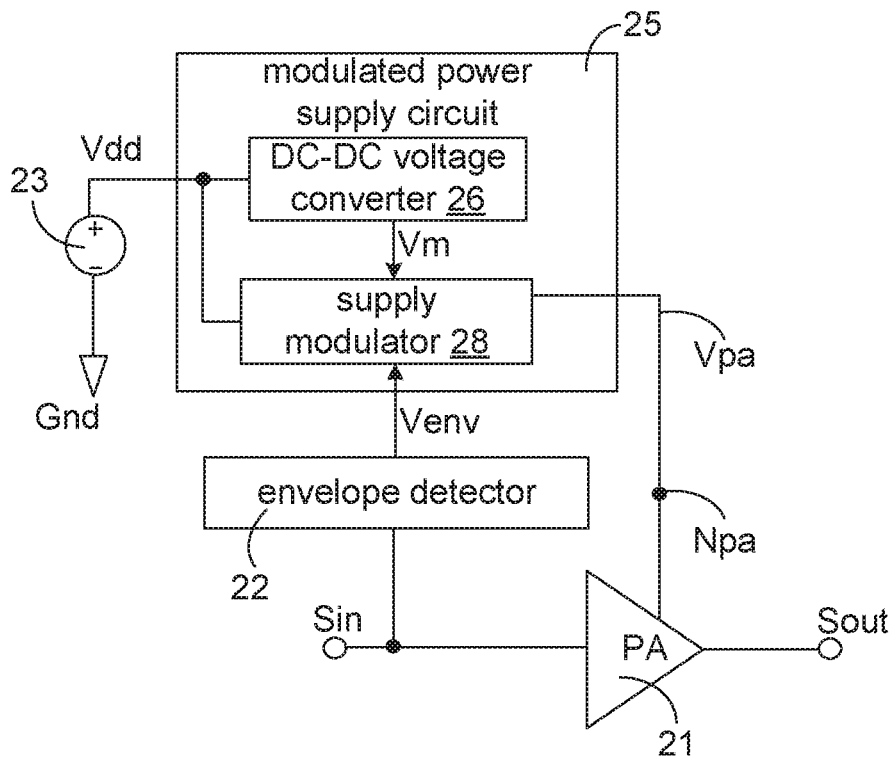
FIG. 2A is a block diagram illustrating a modulated power supply circuit capable of supplying the modulated voltage Vpa to the power amplifier according to the embodiment of the present disclosure.

FIG. 2A is a block diagram illustrating a modulated power supply circuit capable of supplying the modulated voltage Vpa to the power amplifier according to the embodiment of the present disclosure. As shown in FIG. 2A, the modulated power supply circuit 25 is electrically connected to a voltage source 23, an envelope detector 22, and a power amplifier 21, and the envelope detector 22 is electrically connected to the power amplifier 21. The power amplifier 21 can be, for example, a class AB amplifier.

The voltage source 23 is configured for supplying a supply voltage Vdd having a constant DC value, and the envelope detector 22 is configured for detecting an envelope tracking signal Venv. The envelope tracking signal Venv represents and/or carries envelope information that is related to amplitude change of the input signal Sin.

The modulated power supply circuit 25 is configured for supplying the modulated voltage Vpa to the power amplifier 21. The modulated power supply circuit 25 further includes a direct current to direct current (DC-DC) voltage converter 26 and a supply modulator 28. The DC-DC voltage converter 26 is configured for converting the supply voltage Vdd to a regulated voltage Vm.

According to the embodiment of the present disclosure, the DC-DC voltage converter 26 can be a boost converter or a buck converter. Thus, the regulated voltage Vm can be greater than or less than the supply voltage Vdd (that is, Vm>Vdd or Vm<Vdd). More details about the DC-DC voltage converter 26 and the supply modulator 28 are illustrated below.

Figure 1A:
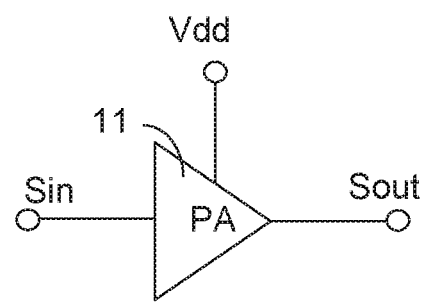
FIG. 1A (prior art) is a block diagram illustrating supplying a supply voltage to a power amplifier based on a fix drain bias approach.

Similar to FIG. 1A, the power amplifier 21 receives the input signal Sin and further amplifies the input signal Sin to generate the amplified output signal Sout. However, instead of receiving the supply voltage Vdd from the voltage source 23, the power amplifier 21 in FIG. 2A receives the modulated voltage Vpa from the modulated power supply circuit 25. Then, the power amplifier 21 operates based on the modulated voltage Vpa.

Figure 2B:
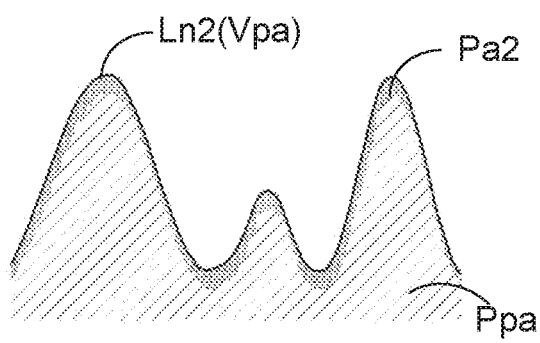
FIG. 2B is a schematic diagram illustrating power supplied to and consumed by the power amplifier based on the envelope tracking bias approach according to the embodiment of the present disclosure.

FIG. 2B is a schematic diagram illustrating power supplied to and consumed by the power amplifier based on the envelope tracking bias approach according to the embodiment of the present disclosure. The curve Ln2 represents the modulated voltage Vpa supplied to the power amplifier 21, the area shown with oblique lines (Ppa) represents actual power consumption of the power amplifier 21, and the area shown with dotted screentone (Pa2) represents the unnecessary power loss in the power amplifier 21.

Figure 1B:
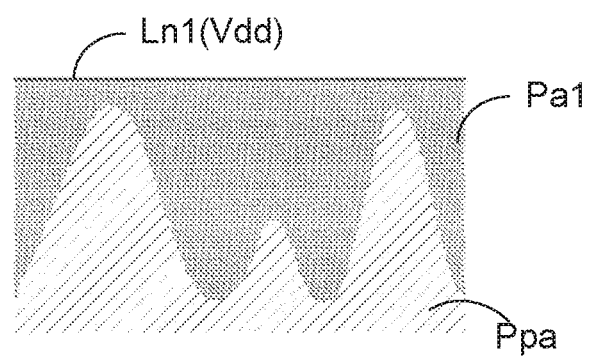
FIG. 1B (prior art) is a schematic diagram illustrating power supplied to and consumed by the power amplifier based on the fixed drain bias approach.

Please refer to FIGS. 1B and 2B together. In FIGS. 1B and 2B, sizes of the areas shown with oblique lines (Ppa) are equivalent, but the sizes of the areas shown with dotted screentone (Pa1, Pa2) are different. As the modulated voltage Vpa being generated at an output terminal Npa of the modulated power supply circuit 25 should have a similar tendency of the input signal Sin, the area with dotted screentone shown in FIG. 2B is much smaller than that in FIG. 1B (Pa2<<Pa1). Therefore, by providing the time-variant power to the power amplifier 21, the power utilization of the modulated power supply circuit 25 becomes more efficient, and the amount of power waste can be reduced.

Figure 3:
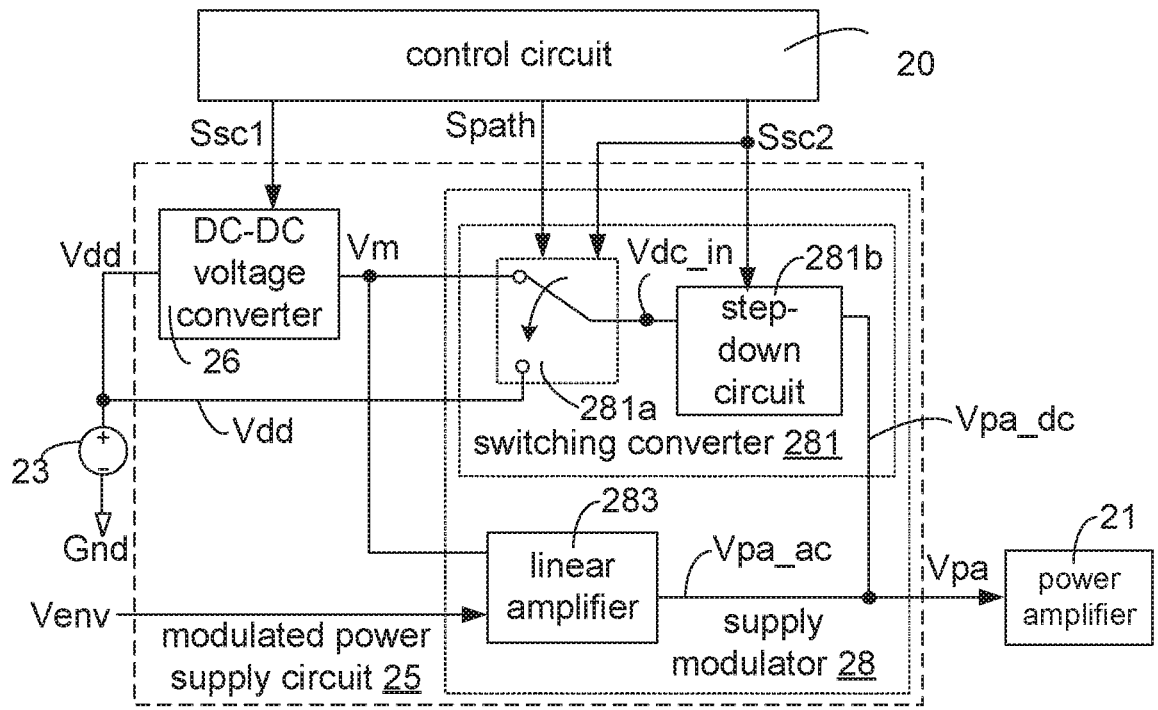
FIG. 3 is a schematic diagram illustrating internal blocks of the modulated power supply circuit according to the embodiment of the present disclosure.

FIG. 3 is a schematic diagram illustrating internal blocks of the modulated power supply circuit according to the embodiment of the present disclosure. The modulated power supply circuit 25 includes a DC-DC voltage converter 26 and a supply modulator 28. The supply modulator 28 includes a switching converter 281 and a linear amplifier 283, and the switching converter 281 further includes a selection circuit 281a and a step-down circuit 281b.

The linear amplifier 283 is electrically connected to the DC-DC voltage converter 26 and the power amplifier 21. The step-down circuit 281b is electrically connected to the power amplifier 21, and the path selection circuit 281a is electrically connected between the DC-DC voltage converter 26 and the step-down circuit 281b.

According to the embodiment of the present disclosure, the modulated voltage Vpa provided by the modulated power supply circuit 25 includes a DC component (Vpa_dc) and an AC component (Vpa_ac). The switching converter 281 is configured for providing the DC component of the modulated voltage Vpa_dc, and the linear amplifier 283 is configured for providing the AC component of the modulated voltage Vpa_ac.

The modulated power supply circuit 25 can jointly operate with a control circuit 20. The control circuit 20 concerns the usage environment of the portable device, selects suitable settings related to the power amplifier and determines how operations of the modulated power supply circuit 25 should be adjusted.

For example, the control circuit 20 may generate and transmit switching control signals Ssc1, Ssc2 and a path selection signal Spath to the modulated power supply circuit 25. A switching control signal Ssc1 is transmitted to the DC-DC voltage converter 26, and another switching control signal Ssc2 is transmitted to the path selection circuit 281a and the step-down circuit 281b. The path selection signal Spath is transmitted to the path selection circuit 281a.

As shown in FIG. 3, the linear amplifier 283 receives the regulated voltage Vm from the DC-DC voltage converter 26. Moreover, the linear amplifier 283 receives the envelope tracking signal Venv. The regulated voltage Vm is utilized by the linear amplifier 283 as its operation voltage, and the envelope tracking signal Venv is further amplified to generate the AC component of the modulated voltage Vpa_ac. Since the regulated voltage Vm is time-variant, the operation voltage of the linear amplifier 283 also changes with time.

The path selection circuit 281a can be, for example, a switch. Being controlled by a path selection signal Spath, the path selection circuit 281a may conduct the regulated voltage Vm from the DC-DC voltage converter 26 to the step-down circuit 281b, or conduct the supply voltage Vdd from the voltage source 23 to the step-down circuit 281b. Thus, the step-down circuit 281b receives one of the supply voltage Vdd and the regulated voltage Vm as its input voltage. For the sake of illustration, the input voltage received by the switching converter 281 can be defined as a DC input voltage Vdc_in.

Then, the step-down circuit 281b converts the DC input voltage Vdc_in to the DC component of the modulated voltage Vpa_dc. The DC component of the modulated voltage Vpa_dc is less than the DC input voltage Vdc_in.

As illustrated above, the DC-DC voltage converter receives the supply voltage Vdd from the voltage source 23 and converts the supply voltage Vdd to the regulated voltage Vm. Moreover, the regulated voltage Vm can be greater than or less than the supply voltage Vdd. Details about how the DC-DC voltage converter 26 operates are illustrated in FIGS. 4, 5A, 5B, 6, 7A and 7B.

Figure 4:
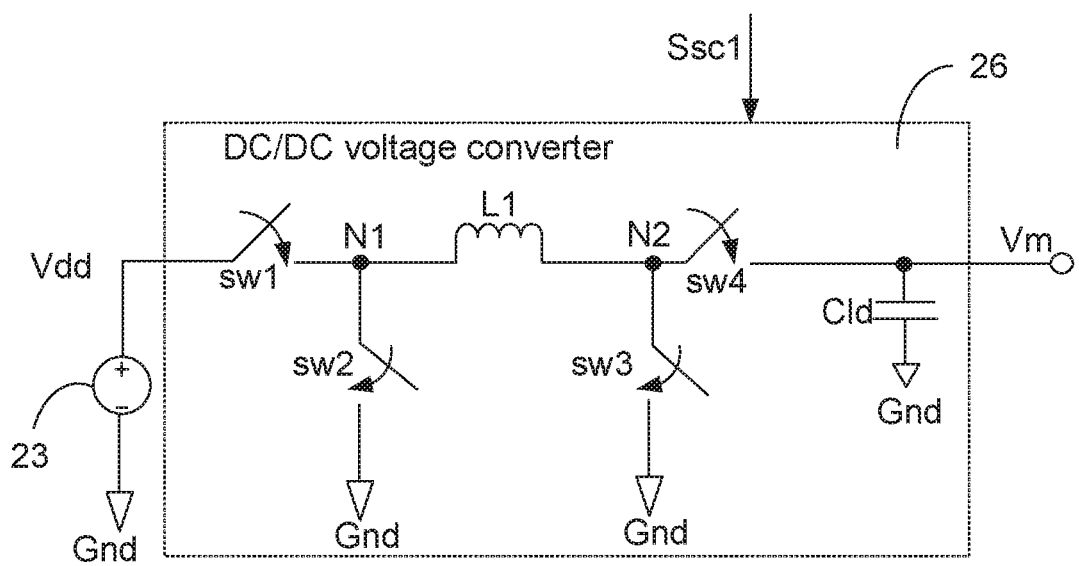
FIG. 4 is a schematic diagram illustrating the DC-DC voltage converter used in the modulated power supply circuit according to the embodiment of the present disclosure.

FIG. 4 is a schematic diagram illustrating the DC-DC voltage converter used in the modulated power supply circuit according to the embodiment of the present disclosure. The DC-DC voltage converter 26 includes four mode switches sw1, sw2, sw3, sw4, an inductor L1 and a loading capacitor Cld. The switching statues of the mode switches sw1, sw2, sw3, sw4 are controlled by the switching control signal Ssc1 and dynamically adjusted, depending on the operation mode of the DC-DC voltage converter 26.

For normal operation of the portable device, the DC-DC voltage converter is usually preferred to operate as the buck converter. Under such circumstances, operations of the DC-DC voltage converter 26 are discussed in FIGS. 5A and 7A.

Occasionally, when the battery is low or when high power UE support is required, the DC-DC voltage converter is desired to operate as the boost converter. Under such circumstances, operations of the DC-DC voltage converter 26 are discussed in FIGS. 5B and 7B.

Figure 5A:
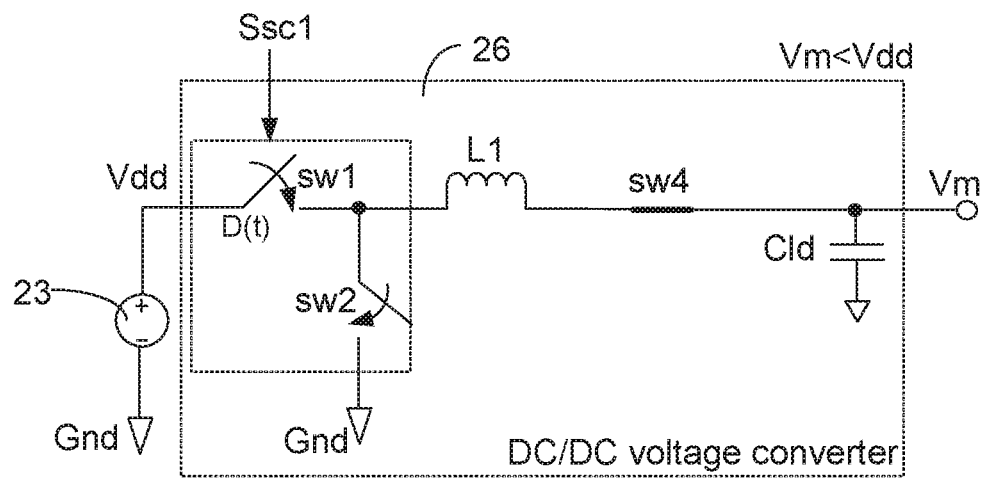
FIG. 5A is a schematic diagram illustrating a step-down mode of the DC-DC voltage converter.

FIG. 5A is a schematic diagram illustrating a step-down mode of the DC-DC voltage converter. When the DC-DC voltage converter 26 operates in the step-down mode as a buck converter, the regulated voltage Vm is less than the supply voltage Vdd. Meanwhile, the mode switches sw1, sw2 are alternatively switched on (toggled), the mode switch sw3 remains OFF, and the mode switch sw4 remains ON. Switching statuses of the mode switches sw1, sw2, sw3, sw4 when the DC-DC voltage converter operates in the step-down mode are shown in FIG. 7A.

Figure 5B:
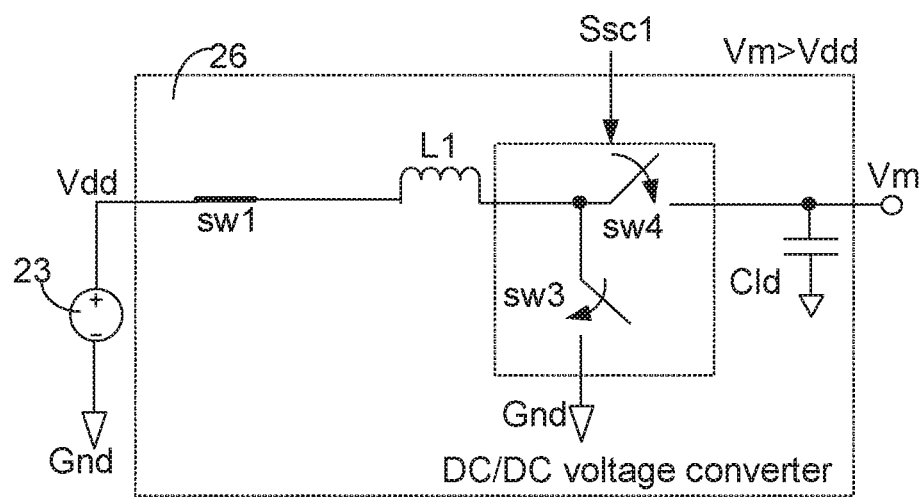
FIG. 5B is a schematic diagram illustrating a step-up mode of the DC-DC voltage converter.

FIG. 5B is a schematic diagram illustrating a step-up mode of the DC-DC voltage converter. When the DC-DC voltage converter 26 operates in the step-up mode as a boost converter, the regulated voltage Vm is greater than the supply voltage Vdd. Meanwhile, the mode switch sw1 remains ON, the mode switch sw2 remains OFF, and the mode switches sw3, sw4 are alternatively switched on (toggled). Switching statuses of the mode switches sw1, sw2, sw3, sw4 when the DC-DC voltage converter operates in the step-up mode are shown in FIG. 7B.

Figure 6:
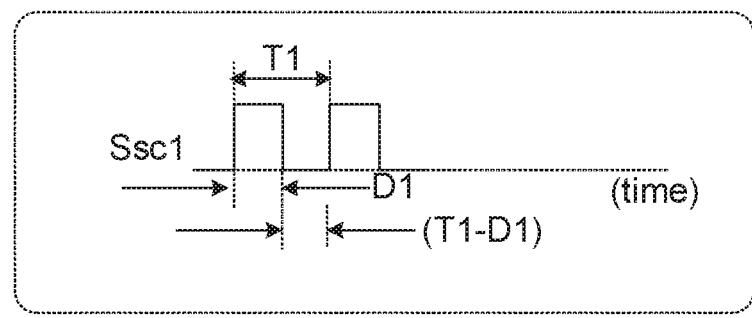
FIG. 6 is a schematic waveform illustrating the switching control signal Ssc1 for controlling the mode switches in the DC-DC voltage converter.

FIG. 6 is a schematic waveform illustrating the switching control signal Ssc1 for controlling the mode switches in the DC-DC voltage converter. The period of the switching control signal Ssc1 is represented as T1. The switching control signal Ssc1 is at a high level during a pulse duration D1, and the switching control signal Ssc1 is at a low level during a non-pulse duration (T1-D1).

Figure 7A:
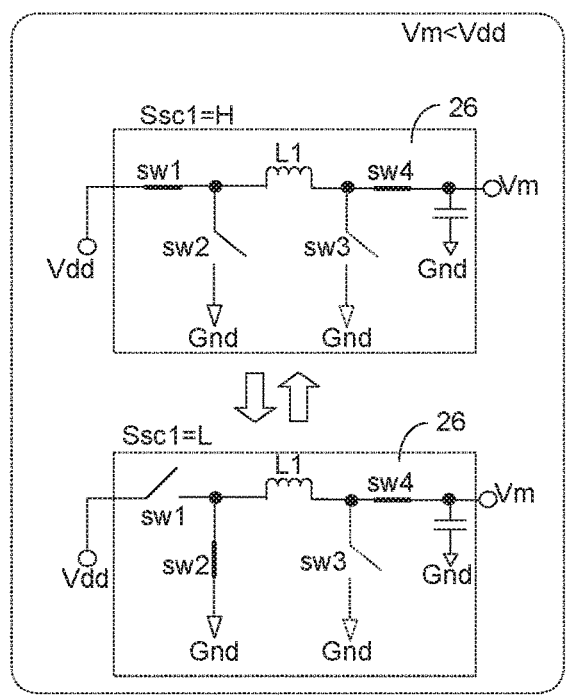
FIG. 7A is a schematic diagram illustrating switching statuses of the mode switches when the DC-DC voltage converter operates in the step-down mode.

FIG. 7A is a schematic diagram illustrating switching statuses of the mode switches when the DC-DC voltage converter operates in the step-down mode. In a case that the DC-DC voltage converter 26 operates in the step-down mode, the upper part of FIG. 7A shows that the mode switch sw1 is turned on, and the mode switch sw2 is turned off if the switching control signal Ssc1 is at the high level during the pulse duration D1, and the mode switch sw1 is turned off, and the lower part of FIG. 6A shows that the mode switch sw2 is turned on if the switching control signal Ssc1 is at the low level during the non-pulse duration (T1-D1).

Figure 7B:
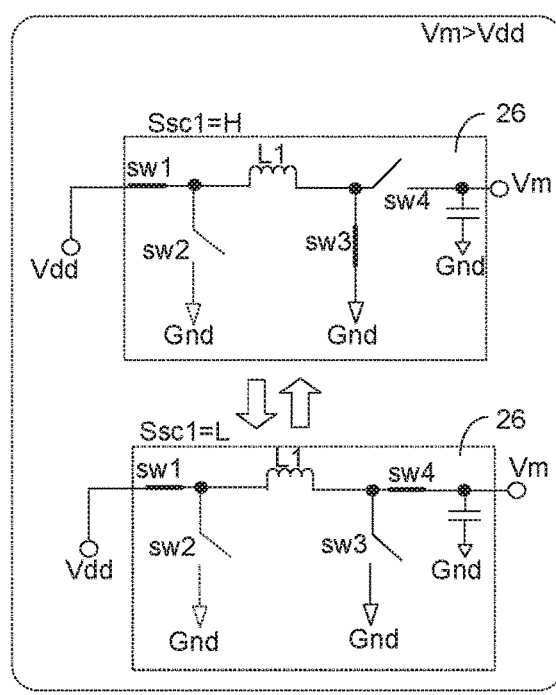
FIG. 7B is a schematic diagram illustrating switching statuses of the mode switches when the DC-DC voltage converter operates in the step-up mode.

FIG. 7B is a schematic diagram illustrating switching statuses of the mode switches when the DC-DC voltage converter operates in the step-up mode. In a case that the DC-DC voltage converter 26 operates in the step-up mode, the upper part of FIG. 7B shows that the mode switch sw3 is turned on, and the mode switch sw4 is turned off if the switching control signal Ssc1 is at the high level during the pulse duration D1, and the lower part of FIG. 7B shows that the mode switch sw3 is turned off, and the mode switch sw4 is turned on if the switching control signal Ssc1 is at the low level during the non-pulse duration (T1-D1).

Figure 8:
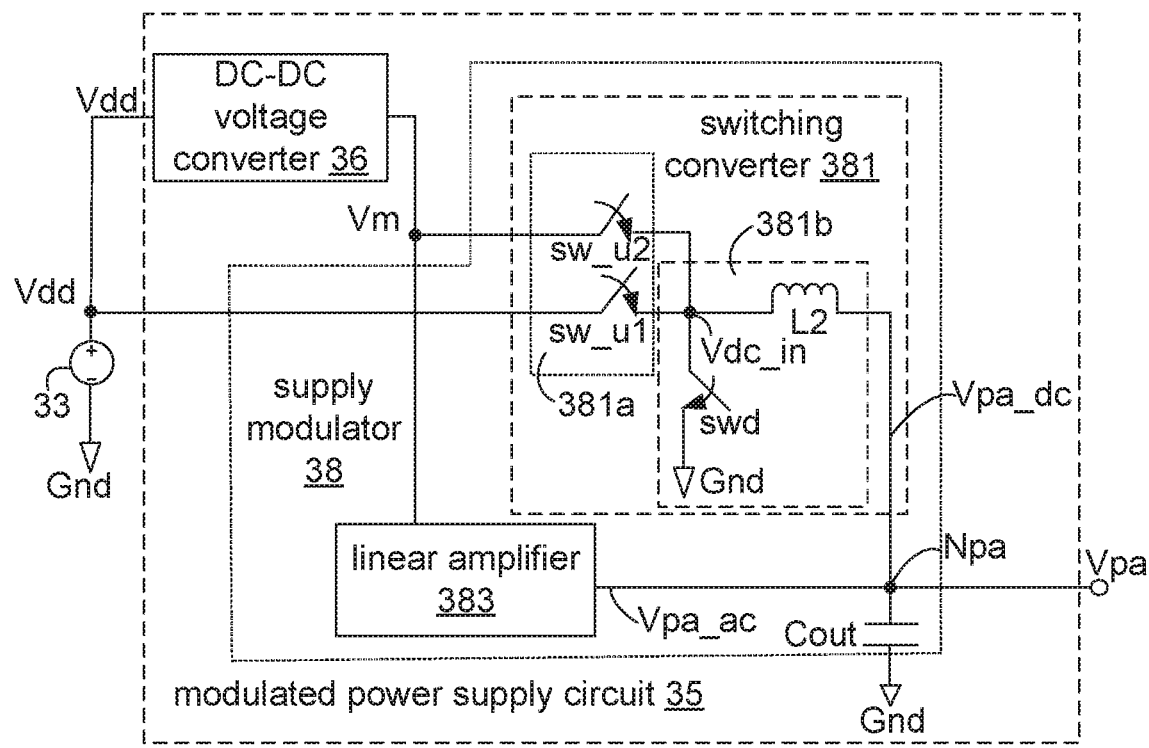
FIG. 8 is a schematic diagram illustrating a configuration of the modulated power supply circuit according to the embodiment of the present disclosure.

FIG. 8 is a schematic diagram illustrating a configuration of the modulated power supply circuit according to the embodiment of the present disclosure. The modulated power supply circuit 35 includes a DC-DC voltage converter 36 and a supply modulator 38. The supply modulator 38 includes a linear amplifier 383, a switching converter 381 and an output capacitor Cout. The switching converter 381 further includes a selection circuit 381a and a step-down circuit 381b. The output capacitor Cout is electrically connected to the output terminal Npa and the ground terminal Gnd.

The selection circuit 381a includes two selection switches sw_u1, sw_u2, which are controlled by the switching control signal Ssc2. The selection switch sw_u1 is electrically connected between the DC-DC voltage converter 36 and the step-down circuit 381b, and the selection switch u2 is electrically connected between the voltage source 33 and the step-down circuit 381b.

As illustrated above, the input voltage of the switching converter 381 is defined as the DC input voltage Vdc_in, which can be selected from one of the supply voltage Vdd and the regulated voltage Vm. When the switching control signal Ssc2 turns on the selection switch sw_u1, the supply voltage Vdd is considered as the DC input voltage Vdc_in of the switching converter 381. When the switching control signal Ssc2 turns on the selection switch sw_u2, the regulated voltage Vm is considered as the DC input voltage Vdc_in of the switching converter 381.

According to the embodiment of the present disclosure, the step-down circuit 381b performs a step-down function. In other words, the output voltage of the switching converter 381, that is, the DC component of the modulated voltage Vpa_dc is less than the DC input voltage Vdc_in. The step-down circuit 381b includes an inductor L2 and a step-down switch swd. The step-down switch swd is selectively turned on, depending on the voltage level of the switching control signal Ssc2. Details about how the DC-DC voltage converter 26 operates are illustrated in FIGS. 10, 11, 12A, 12B, 13A and 13B.

In the modulated power supply circuits 35, 45, the efficiencies of the DC-DC voltage converters 36, 46 are better than the efficiencies of the linear amplifiers 383, 483. Thus, it is preferred to use the DC-DC voltage converters 36, 46 to provide the majority of the modulated voltage Vpa. In addition, the voltage level of the AC component of the modulated voltage Vpa_ac is better to be lowered. Therefore, an AC-coupling scheme shown in FIG. 9 is proposed to reduce the power consumption of the linear amplifier 383.

Figure 9:
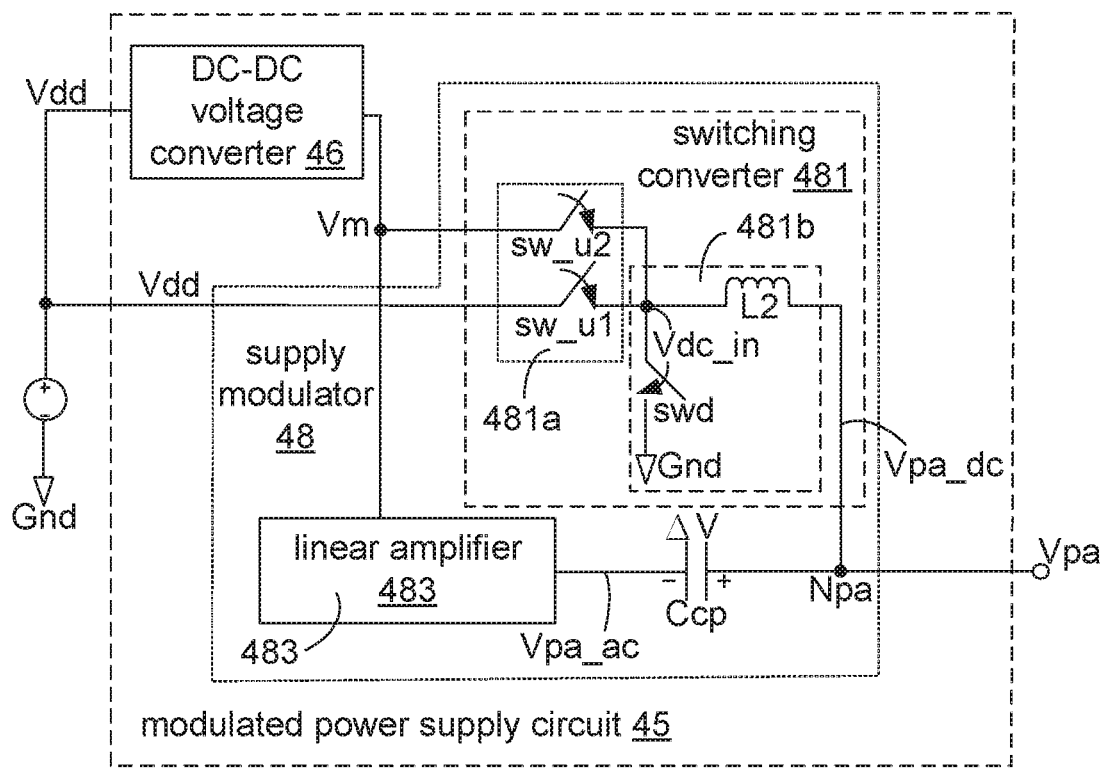
FIG. 9 is a schematic diagram illustrating that the modulated power supply circuit uses the AC coupling scheme.

FIG. 9 is a schematic diagram illustrating that the modulated power supply circuit uses the AC coupling scheme. The modulated power supply circuit 45 includes a DC-DC voltage converter 46 and a supply modulator 48. The supply modulator 48 includes a linear amplifier 483, a switching converter 481, and a coupling capacitor Ccp. Unlike the output capacitor Cout, the coupling capacitor Ccp is electrically connected between the linear amplifier 483 and the output terminal Nap.

The switching converter 481 includes a selection circuit 481a and a step-down circuit 481b. The selection circuit 481a further includes selections switches sw_u1, sw_u2, and the step-down circuit 481 further includes an inductor L2 and a step-down switch swd. Operations of the switching converter 481 are similar to those of the switching converter 381, and details are not redundantly illustrated.

When the AC coupling scheme is used, the output terminal of the linear amplifier 483 is electrically connected to the negative terminal (−) of the coupling capacitor Ccp. This implies that a capacitor voltage difference ΔV exists between the two terminals of the coupling capacitor Ccp, and swing of the output of the linear amplifier 483 can be suppressed. Accordingly, the output power of the linear amplifier 483 can be reduced, so as the total power consumption of the modulated power supply circuit 45.

If the original variation range of the swing of the AC signal is 3V~5V, and if use of the coupling capacitor Ccp allows the variation range of the swing of the AC component of the modulated voltage Vpa_ac to be decreased to 1V~3V, the swing of the output of the linear amplifier 483 (FIG. 9) is much smaller than that of the linear amplifier 383 (FIG. 8). Based on the AC coupling scheme, the power required by the linear amplifier 483 becomes less, and efficiency of the modulated power supply circuit 45 becomes better.

FIG. 10 is a schematic diagram illustrating an implementation of the selection circuit. The modulated power supply circuit 57 includes a DC-DC voltage converter 56, a linear amplifier 583, a switching converter 58, and a coupling capacitor Ccp.

The switching converter 58 includes selections switches s_u1, sw_u2, a step-down switch swd, an inductor L2, and a control switch sw_c. In FIG. 10, the selection switch sw_u1 is assumed to be a PMOS transistor M1, and the selection switch sw_u2 is assumed to be another PMOS transistor M2. The step-down switch swd is assumed to be an NMOS transistor M3.

In FIG. 10, the control switch sw_c is electrically connected to the control circuit to receive a complementary switching control signal Ssc2'. The complementary switching control signal Ssc2' has an opposite logic level of the switching control signal Ssc2. Switching status of the control switch sw_c is controlled by the path selection signal Spath, The path selection signal Spath may be used to conduct the complementary switching control signal Ssc2' to the transistor M2 or to the transistor M1.

The source terminal of transistor M1 is electrically connected to the voltage source 53 for receiving the supply voltage Vdd. The source terminal of transistor M2 is electrically connected to the DC-DC voltage converter 56 for receiving the regulated voltage Vm. The drain terminals of the transistors M1, M2, M3 are electrically connected together. The gate terminal of the transistor M3 is electrically connected to the control circuit to receive the complementary switching control signal Ssw2'. The gate terminals of the transistors M1, M3 are selectively electrically connected to the control circuit to receive the complementary switching control circuit Ssw2'. According to the embodiment of the present disclosure, connections of the body terminals of the transistor M1, M2 are related to several parameters, for example, voltage levels of the supply voltage Vdd and the regulated voltage Vm, which of the supply voltage Vdd and the regulated voltage Vm is selected as the DC input voltage Vdc_in, and so forth.

In FIG. 10, only one of the transistors M1, M2 is turned on at the same time. When the path selection signal Spath selects to conduct the complementary switching control signal Ssc2' to the transistor M1, the transistor M1 is turned on and the supply voltage Vdd is considered as the DC input voltage Vdc_in. When the path selection signal Spath selects to conduct the complementary switching control signal Ssc2' to the transistor M2, the transistor M2 is turned on and the regulated voltage Vm is considered as the DC input voltage Vdc_in.

FIG. 11 is a schematic diagram illustrating the switching control signal Ssc2 for controlling the step-down switch in the DC-DC voltage converter The period of the switching control signal Ssc2 is represented as T2. The switching control signal Ssc2 is at a high level during the pulse duration D2, and the switching control signal Ssc2 is at a low level during the non-pulse duration (T1-D2).

In some applications, the power amplifier may need to support high power user equipment (UE), and the modulated voltage Vpa higher than the battery can support may be required. Under such circumstance, the DC input voltage Vdc_in must be greater than the supply voltage Vdd. Otherwise, the DC component of the modulated voltage Vpa_dc is not enough. According to the embodiment of the present disclosure, the switching control signals Ssc1, Ssc2, and the DC input voltage Vdc_in can be freely adjusted by the control circuit to support various requirements of different applications of the power amplifier. Details about how connections of the body terminals of the transistors M1, M2 are adjusted in response to different settings of the switching control signal Ssc2 and the DC input voltage Vdc_in are illustrated in FIGS. 12A, 12B, 13A, and 13B.

Figure 12A:
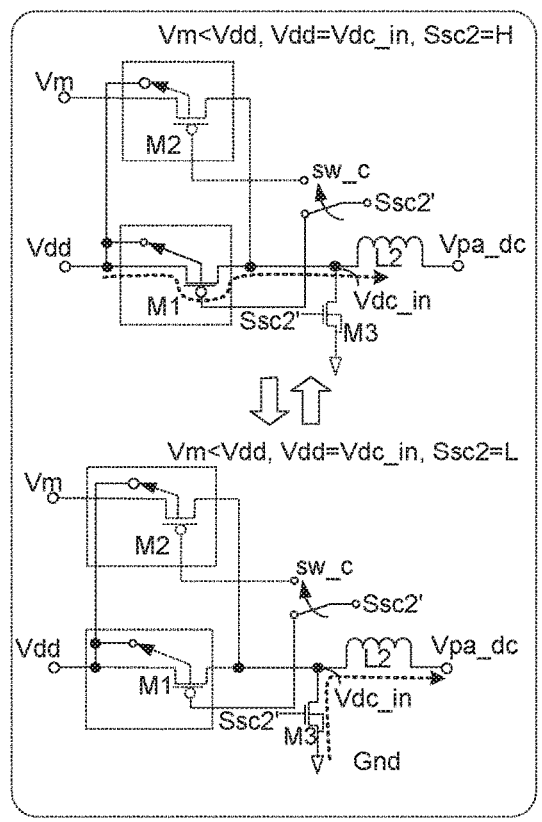
FIG. 12A is a schematic diagram illustrating the configuration of the switching converter when the regulated voltage Vm is less than the supply voltage Vdd (Vm<Vdd) and when the supply voltage Vdd is selected as the DC input voltage Vdc_in.

FIG. 12A is a schematic diagram illustrating the configuration of the switching converter when the regulated voltage Vm is less than the supply voltage Vdd (Vm<Vdd) and when the supply voltage Vdd is selected as the DC input voltage Vdc_in. Table 1 is a table listing the switching statues and connections of the body terminals of transistors M1, M2, M3 shown in FIG. 12A. The first row is corresponding to the upper part of FIG. 12A and the second row is corresponding to the lower part of FIG. 12A.

TABLE 1

| duration | transistor M1 switching status | transistor M1 body terminal | transistor M2 switching status | transistor M2 body terminal | transistor M3 switching status |
|---|---|---|---|---|---|
| D2 | ON | Vdd | OFF | Vdd | OFF |
| T2-D2 | OFF | | | | ON |

When the supply voltage Vdd is selected as the DC input voltage Vdc_in, the transistor M2 remains to be turned off, regardless of changes of the switching control signal Ssc2. On the other hand, the transistors M1, M3 are selectively turned on, depending on the voltage level of the switching control signal Ssc2.

The upper part of FIG. 12A shows that the transistor M1 is turned on, and the transistor M3 is turned off when the switching control signal Ssc2 is at the high level (Ssc2'=L, pulse duration D2). The lower part of FIG. 12A shows that the transistor M1 is turned off, and the transistor M3 is turned on when the switching control signal Ssc2 is at the low level (Ssc2'=H, non-pulse duration (T2-D2)).

As the regulated voltage Vm in FIG. 12A is assumed to be less than the supply voltage Vdd, the body terminal of the transistor which remains to be turned off (that is, transistors M2 as shown in the upper part and the lower part of FIG. 12A) are biased at the supply voltage Vdd to ensure that no leakage current is generated at the transistor M2. Therefore, in FIG. 12A, body terminals of the transistors M1, M2 are biased at the supply voltage Vdd.

Figure 12B:
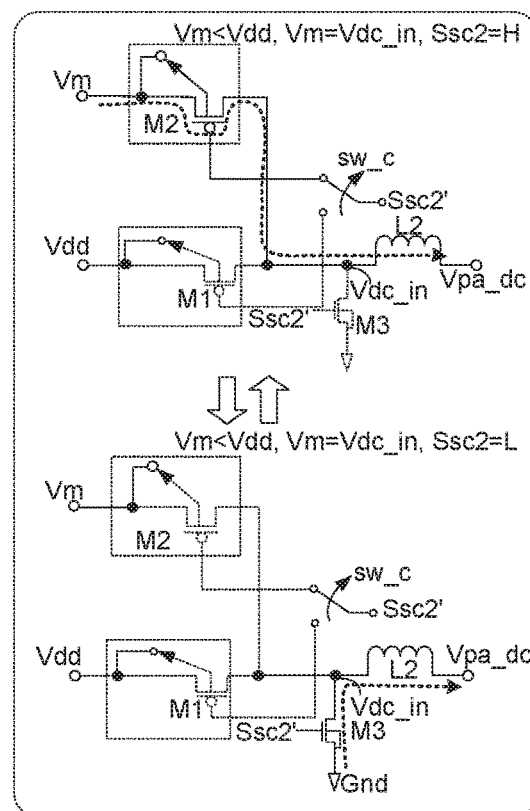
FIG. 12B is a schematic diagram illustrating the configuration of the switching converter when the regulated voltage Vm is less than the supply voltage Vdd (Vm<Vdd) and when the regulated voltage Vm is selected as the DC input voltage Vdc_in.

FIG. 12B is a schematic diagram illustrating the configuration of the switching converter when the regulated voltage Vm is less than the supply voltage Vdd (Vm<Vdd) and when the regulated voltage Vm is selected as the DC input voltage Vdc_in, Table 2 is a table listing the switching statuses and connections of the transistors M1, M2, M3 shown in FIG. 12B. The first row is corresponding to the upper part of FIG. 12B and the second row is corresponding to the lower part of FIG. 12B.

TABLE 2

| duration | transistor M1 switching status | transistor M1 body terminal | transistor M2 switching status | transistor M2 body terminal | transistor M3 switching status |
|---|---|---|---|---|---|
| D2 | OFF | Vm | ON | Vm | OFF |
| T2-D2 | | | OFF | | ON |

When the regulated voltage Vm is selected as the DC input voltage Vdc_in, the transistor M1 remains to be turned off, regardless of changes of the switching control signal Ssc2. On the other hand, the transistors M2, M3 are alternately turned on, depending on the voltage level of the switching control signal Ssc2.

The upper part of FIG. 12B shows that the transistor M2 is turned on and the transistor M3 is turned off when the switching control signal Ssc2 is at the high level (Ssc2'=L, pulse duration D2). The lower part of FIG. 12B shows that the transistor M2 is turned off and the transistor M3 is turned on when the switching control signal Ssc2 is at the low level (Ssc2'=H, non-pulse duration (T2-D2)).

As the regulated voltage Vm in FIG. 12B is assumed to be less than the supply voltage Vdd, the body terminal of the transistor which remains to be turned off (that is, transistor M1 as shown in the upper part and the lower part of FIG. 12B) are biased at the supply voltage Vdd to ensure that no leakage current is generated at the transistors M1. Therefore, in FIG. 12B, body terminals of the transistors M1 are biased at the supply voltage Vdd while body terminals of the transistors M2 are biased at the regulated voltage Vm.

Figure 13A:
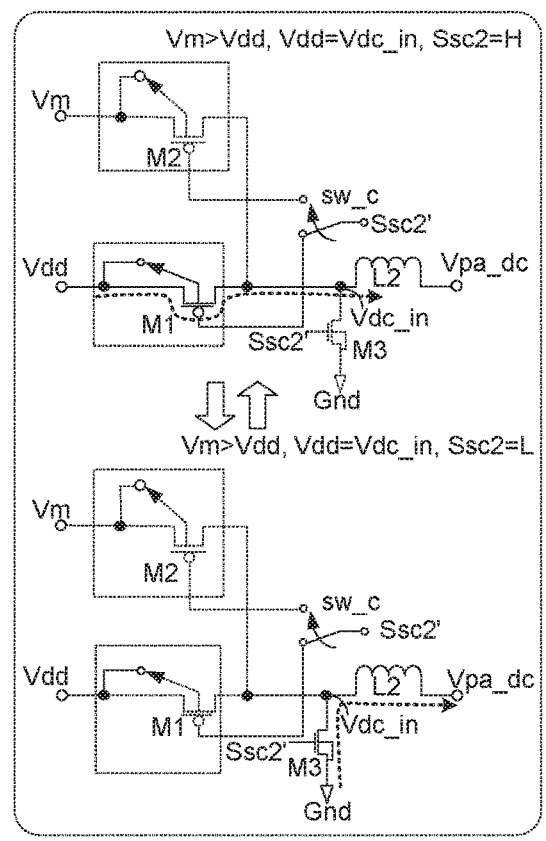
FIG. 13A is a schematic diagram illustrating the configuration of the switching converter when the regulated voltage Vm is greater than the supply voltage Vdd (Vm>Vdd) and when the supply voltage Vdd is selected as the DC input voltage Vdc_in.

FIG. 13A is a schematic diagram illustrating the configuration of the step-up converter when the regulated voltage Vm is greater than the supply voltage Vdd (Vm>Vdd) and when the supply voltage Vdd is selected as the DC input voltage Vdc_in. Table 3 is a table listing the connection statuses shown in FIG. 13A. The first row is corresponding to the upper part of FIG. 13A and the second row is corresponding to the lower part of FIG. 13A.

TABLE 3

| duration | transistor M1 switching status | transistor M1 body terminal | transistor M2 switching status | transistor M2 body terminal | transistor M3 switching status |
|---|---|---|---|---|---|
| D2 | ON | Vdd | OFF | Vm | OFF |
| T2-D2 | OFF | | | | ON |

When the supply voltage Vdd is selected as the DC input voltage Vdc_in, the transistor M2 remains to be turned off, regardless of changes of the switching control signal Ssc2. On the other hand, the transistors M1, M3 are selectively turned on, depending on the voltage level of the switching control signal Ssc2.

The upper part of FIG. 13A shows that the transistor M1 is turned on, and the transistor M3 is turned off when the switching control signal Ssc2 is at the high level (Ssc2'=L, pulse duration D2). The lower part of FIG. 13A shows that the transistor M1 is turned off, and the transistor M3 is turned on when the switching control signal Ssc2 is at the low level (Ssc2'=H, non-pulse duration (T2-D2)).

As the regulated voltage Vm in FIG. 13A is assumed to be greater than the supply voltage Vdd, the body terminal of the transistor which remains to be turned off (that is, transistors M2 as shown in the upper part and the lower part of FIG. 13A) are biased at the regulated voltage Vm to ensure that no leakage current is generated at the transistors M2. Therefore, in FIG. 13A, body terminals of the transistors M1 are biased at the supply voltage Vdd while body terminals of the transistors M2 are biased at the regulated voltage Vm.

Figure 13B:
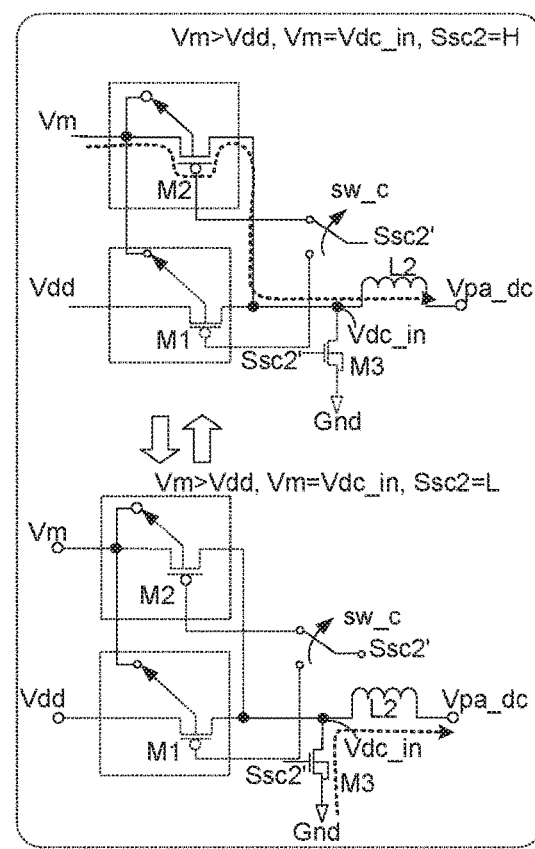
FIG. 13B is a schematic diagram illustrating the configuration of the switching converter when the regulated voltage Vm is greater than the supply voltage Vdd (Vm>Vdd) and when the regulated voltage Vm is selected as the DC input voltage Vdc_in.

FIG. 13B is a schematic diagram illustrating the configuration of the step-up converter when the regulated voltage Vm is greater than the supply voltage Vdd (Vm>Vdd) and when the regulated voltage Vm is selected as the DC input voltage Vdc_in. Table 4 is a table listing the connection statuses shown in FIG. 13B. The first row is corresponding to the upper part of FIG. 13B and the second row is corresponding to the lower part of FIG. 13B.

TABLE 4

| duration | transistor M1 | | transistor M2 | | transistor M3 |
|---|---|---|---|---|---|
| | switching status | body terminal | switching status | body terminal | switching status |
| D2 | OFF | Vdd | ON | Vm | OFF |
| T2-D2 | | | OFF | | ON |

When the regulated voltage Vm is selected as the DC input voltage Vdc_in, the transistor M1 remains to be turned off, regardless of changes of the switching control signal Ssc2. On the other hand, the transistors M2, M3 are alternately turned on, depending on the voltage level of the switching control signal Ssc2.

The upper part of FIG. 13B shows that the transistor M2 is turned on and the transistor M3 is turned off when the switching control signal Ssc2 is at the high level (Ssc2'=L, pulse duration D2). The lower part of FIG. 13B shows that the transistor M1 is turned off and the transistor M3 is turned on when the switching control signal Ssc2 is at the low level (Ssc2'=H, non-pulse duration (T2-D2)).

As the regulated voltage Vm in FIG. 13B is assumed to be greater than the supply voltage Vdd, the body terminal of the transistor which remains to be turned off (that is, transistors M1 as shown in the upper part and the lower part of FIG. 13B) are biased at the regulated voltage Vm to ensure that no leakage current is generated at the transistor M1. Therefore, in FIG. 13B, body terminals of the transistors Ml, M2 are biased at the regulated voltage Vm.

Please refer to FIGS. 12A and 13A together. In a case that the supply voltage Vdd is selected as the DC input voltage Vdc_in, the body terminal of the transistor M1 is connected to receive the supply voltage Vdd, while the connection of the body terminal of the transistor M2 is not fixed but dependent on a comparison between the supply voltage Vdd and the regulated voltage Vm. Although transistors M2 in both FIGS. 12A and 13A remain to be turned off, connections of the transistors M2 in these figures are not completely identical.

When the supply voltage Vdd is greater than the regulated voltage Vm, the body terminal of the transistor M2 receives the supply voltage Vdd (FIG. 12A). When the supply voltage Vdd is less than the regulated voltage Vm, the body terminal of the transistor M2 receives the regulated voltage Vm (FIG. 13A). Alternatively speaking, the body terminal of the transistor M2 which remains to be turned off when the supply voltage Vdd is considered as the DC input voltage Vdc_in is electrically connected to whichever of the supply voltage Vdd and the regulated voltage Vm having the greater voltage level.

Please refer to FIGS. 12B and 13B together. In a case that the regulated voltage Vm is selected as the DC input voltage Vdc_in, the body terminal of the transistor M2 is connected to receive the regulated voltage Vm, while the connection of the body terminal of the transistor M1 is not fixed but dependent on a comparison between the supply voltage Vdd and the regulated voltage Vm. The transistors M1 in both FIGS. 12B and 13B remain to be turned off, but connections of the transistors M1 in these figures are not completely identical.

When the supply voltage Vdd is greater than the regulated voltage Vm, the body terminal of the transistor M1 receives the supply voltage Vdd (FIG. 12B). When the supply voltage Vdd is less than the regulated voltage Vm, the body terminal of the transistor M2 receives the regulated voltage Vm (FIG. 13B). Alternatively speaking, the body terminal of the transistor M1 which remains to be turned off when the regulated voltage Vm is considered as the DC input voltage Vdc_in is electrically connected to whichever of the supply voltage Vdd and the regulated voltage Vm having the greater voltage level.

As illustrated above, a modulated power supply circuit including a supply modulator supplies a modulated voltage Vpa, including an AC component Vpa_ac and a DC component Vpa_dc, to a power amplifier. Moreover, a control method of the modulated power supply circuit is provided. The control method can be summarized to include the following steps.

Firstly, a supply voltage Vdd is converted to a regulated voltage Vm by the DC-DC voltage converter. The regulated voltage Vm can be greater than or less than the supply voltage Vdd. Then, the AC component of the modulated voltage Vpa_ac is generated by the linear amplifier according to the regulated voltage Vm and an envelope tracking signal Venv. The envelope tracking signal Venv instantaneously tracks amplitude change of the input signal Sin of the power amplifier. On the other hand, the supply voltage Vdd is also received by the switching converter. The switching converter further utilizes one of the supply voltage Vdd and the regulated voltage Vm as the DC input voltage Vdc_in and converts the DC input voltage Vdc_in to the DC component of the modulated voltage Vpa_dc. The switching converter performs a step-down conversion so that the DC component of the modulated voltage Vpa_dc is less than the DC input voltage Vdc_in.

As illustrated above, power efficiency and thermal reduction of the modulated power supply circuit can be improved. Moreover, the linearity of the power amplifier can be improved, and higher operation power can be provided by the power amplifier. The modulated power supply circuit can be used in many portal applications where efficiency and battery life are paramount.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A supply modulator, configured for supplying a modulated voltage to a power amplifier, comprising:
   a linear amplifier, electrically connected to a direct current to direct current (DC-DC) voltage converter, configured for generating an alternating current (AC) component of the modulated voltage according to a regulated voltage and an envelope tracking signal, wherein the DC-DC voltage converter converts a supply voltage to the regulated voltage, and the regulated voltage is greater than or less than the supply voltage; and a switching converter, comprising:

a step-down circuit, electrically connected to the power amplifier, configured for converting a direct current (DC) input voltage to a DC component of the modulated voltage, wherein the DC component of the modulated voltage is less than the DC input voltage; and a path selection circuit, electrically connected to the DC-DC voltage converter and the step-down circuit, configured for transmitting one of the supply voltage and the regulated voltage which is utilized as the DC input voltage to the step-down circuit.

2. The supply modulator according to claim 1, wherein the DC-DC voltage converter comprises:

a first inductor having a first terminal and a second terminal;

a first mode switch, electrically connected to the first terminal, configured for receiving the supply voltage;

a second mode switch, electrically connected to the first terminal and a ground terminal;

a third mode switch, electrically connected to the second terminal and the ground terminal;

a fourth mode switch, electrically connected to the second terminal and the path selection circuit; and, a loading capacitor, electrically connected to the fourth mode switch, the ground terminal and the path selection circuit, wherein the regulated voltage is related to switching statuses of the first mode switch, the second mode switch, the third mode switch and the fourth mode switch.

3. The supply modulator according to claim 2, wherein when the regulated voltage is less than the supply voltage, the first mode switch and the second mode switch are alternatively turned on, the third mode switch is turned off, and the fourth mode switch is turned on.

4. The supply modulator according to claim 2, wherein when the regulated voltage is greater than the supply voltage, the first mode switch is turned on, the second mode switch is turned off, and the third mode switch and the fourth mode switch are alternatively turned on.

5. The supply modulator according to claim 1, wherein the DC-DC voltage converter and the supply modulator are electrically connected to a voltage source configured for providing the supply voltage, and the path selection circuit comprises:

a first selection switch, electrically connected to the voltage source and the step-down circuit, configured for conducting the supply voltage to the step-down circuit; and a second selection switch, electrically conned between the DC-DC voltage converter and the step-down circuit, configured for conducting the regulated voltage to the step-down circuit, wherein one of the first selection switch and the second selection switch is selected and switched on by a path selection signal.

6. The supply modulator according to claim 5, wherein the step-down circuit comprises:

a second inductor, electrically connected to the first selection switch and the second selection switch; and a step-down switch, electrically connected to the first selection switch, the second selection switch, the second inductor and a ground terminal, wherein the one of the first selection switch and the second selection switch being selected by the path selection signal and the step-down switch are alternatively switched on.

7. The supply modulator according to claim 6, wherein the first selection switch is a first PMOS transistor, the second selection switch is a second PMOS transistor, and the step-down switch is an NMOS transistor.

8. The supply modulator according to claim 7, wherein when the first PMOS transistor is selected and turned on by the path selection signal, the first PMOS transistor conducts the supply voltage to the step-down circuit as the DC input voltage, and a body terminal of the second PMOS transistor is conducted to one of the supply voltage and the regulated voltage whichever has a greater voltage level.

9. The supply modulator according to claim 7, wherein when the second PMOS transistor is selected and turned on by the path selection signal, the second PMOS transistor conducts the regulated voltage to the step-down circuit as the DC input voltage, and a body terminal of the first PMOS transistor is conducted to one of the supply voltage and the regulated voltage whichever has a greater voltage level.

10. The supply modulator according to claim 1, wherein the linear amplifier is electrically connected to the power amplifier through an output terminal, and the supply modulator further comprises:

an output capacitor, electrically connected to the output terminal and a ground terminal, wherein the modulated voltage formed at the output terminal comprises the AC component of the modulated voltage and the DC component of the modulated voltage.

11. The supply modulator according to claim 1, wherein the supply modulator further comprises:

a coupling capacitor, electrically connected to the linear amplifier and the power amplifier, configured for providing a capacitor voltage difference.

12. The supply modulator according to claim 1, wherein the envelope tracking signal is related to amplitude change of an input signal being received by the power amplifier, and the power amplifier operates based on the modulated voltage.

13. A modulated power supply circuit, configured for supplying a modulated voltage to a power amplifier, wherein the modulated power supply circuit comprises:

a direct current to direct current (DC-DC) converter, configured for converting a supply voltage to a regulated voltage, wherein the regulated voltage is greater than or less than the supply voltage; and a supply modulator, comprising:

a linear amplifier, electrically connected to the DC-DC voltage converter, configured for generating an alternating current (AC) component of the modulated voltage according to the regulated voltage and an envelope tracking signal; and a switching converter, comprising:

a step-down circuit, electrically connected to the power amplifier, configured for converting a direct current (DC) input voltage to a DC component of the modulated voltage, wherein the DC component of the modulated voltage is less than the DC input voltage; and a path selection circuit, electrically connected to the DC-DC voltage converter and the step-down circuit, configured for transmitting one of the supply voltage and the regulated voltage which is utilized as the DC input voltage to the step-down circuit.

14. The modulated power supply circuit according to claim 13, wherein the DC-DC voltage converter and the supply modulator are electrically connected to a voltage source configured for providing the supply voltage, and the path selection circuit comprises:
a first selection switch, electrically connected to the voltage source and the step-down circuit, configured for conducting the supply voltage to the step-down circuit; and
a second selection switch, electrically conned between the DC-DC voltage converter and the step-down circuit, configured for conducting the regulated voltage to the step-down circuit,
wherein one of the first selection switch and the second selection switch is selected and switched on by a path selection signal.

15. The modulated power supply circuit according to claim 14, wherein the step-down circuit comprises:
a first inductor, electrically connected to the first selection switch and the second selection switch; and
a step-down switch, electrically connected to the first selection switch, the second selection switch, the first inductor and a ground terminal, wherein the one of the first selection switch and the second selection switch being selected by the path selection signal and the step-down switch are alternatively switched on.

16. The modulated power supply circuit according to claim 15, wherein the first selection switch is a first PMOS transistor, the second selection switch is a second PMOS transistor, and the step-down switch is an NMOS transistor.

17. The modulated power supply circuit according to claim 16, wherein
when the first PMOS transistor is selected and turned on by the path selection signal, the first PMOS transistor conducts the supply voltage to the step-down circuit as the DC input voltage, and a body terminal of the second PMOS transistor is conducted to one of the supply voltage and the regulated voltage whichever has a greater voltage level.

18. The modulated power supply circuit according to claim 16, wherein
when the second PMOS transistor is selected and turned on by the path selection signal, the second PMOS transistor conducts the regulated voltage to the step-down circuit as the DC input voltage, and a body terminal of the first PMOS transistor is conducted to one of the supply voltage and the regulated voltage whichever has a greater voltage level.

19. The modulated power supply circuit according to claim 13, wherein the envelope tracking signal is related to amplitude change of an input signal being received by the power amplifier, and the power amplifier operates based on the modulated voltage.

20. A control method of a modulated power supply circuit, wherein the modulated power supply circuit supplies a modulated voltage to a power amplifier, and the control method comprises steps of:
converting a supply voltage to a regulated voltage, wherein the regulated voltage is greater than or less than the supply voltage;
generating an alternating current (AC) component of the modulated voltage according to the regulated voltage and an envelope tracking signal;
utilizing one of the supply voltage and the regulated voltage as a direct current (DC) input voltage; and
converting the DC input voltage to a DC component of the modulated voltage, wherein the DC component of the modulated voltage is less than the DC input voltage.

* * * * *